US006818951B2

(12) United States Patent
Moller et al.

(10) Patent No.: US 6,818,951 B2
(45) Date of Patent: Nov. 16, 2004

(54) ARRANGEMENT IN A POWER MOSFET

(75) Inventors: Thomas Moller, Gilroy, CA (US); Nils Af Ekenstam, Solna (SE); Jan Johansson, Upplands Våsby (SE); Timothy Ballard, Gilroy, CA (US); Gary Lopes, Rancho Palos Verdes, CA (US); Michael Peternel, Morgan Hill, CA (US)

(73) Assignee: Telefonaktiebolaget LM Ericsson, Stockholm (SE)

( * ) Notice: Subject to any disclaimer, the term of this patent is extended or adjusted under 35 U.S.C. 154(b) by 0 days.

(21) Appl. No.: 09/906,697

(22) Filed: Jul. 18, 2001

(65) Prior Publication Data

US 2002/0047140 A1 Apr. 25, 2002

(30) Foreign Application Priority Data

Jul. 19, 2000 (SE) .............................................. 0002714

(51) Int. Cl.[7] .................... H01L 29/76; H01L 29/94; H01L 31/062; H01L 31/113; H01L 31/119
(52) U.S. Cl. .................... 257/341; 257/335; 257/336
(58) Field of Search ................ 257/288, 287, 257/314, 341, 335, 336

(56) References Cited

U.S. PATENT DOCUMENTS

| 4,665,423 A | * | 5/1987 | Akiya ........................ 357/23.1 |
| 4,914,051 A | * | 4/1990 | Huie et al. .................... 437/59 |
| 5,033,068 A | | 7/1991 | Imai |
| 5,430,316 A | * | 7/1995 | Contiero et al. ............. 257/335 |
| 5,545,908 A | * | 8/1996 | Tokura et al. ............... 257/341 |
| 5,602,416 A | * | 2/1997 | Zambrano .................... 257/500 |
| 5,612,566 A | * | 3/1997 | Williams .................... 257/402 |
| 5,798,550 A | * | 8/1998 | Kuroyanagi et al. ......... 257/341 |
| 5,894,149 A | * | 4/1999 | Uenishi et al. .............. 257/331 |
| 5,923,065 A | * | 7/1999 | So et al. ...................... 257/328 |
| 5,994,175 A | * | 11/1999 | Gardner et al. ............. 438/199 |
| 5,998,837 A | * | 12/1999 | Williams .................... 257/341 |
| 6,046,473 A | * | 4/2000 | Blanchard .................... 257/341 |
| 6,091,279 A | * | 7/2000 | Hamparian ................. 327/513 |
| 6,144,070 A | * | 11/2000 | Devore et al. .............. 257/343 |
| 6,348,382 B1 | * | 2/2002 | Su et al. ...................... 438/275 |
| 6,355,962 B1 | * | 3/2002 | Liang et al. ................. 257/369 |
| 6,380,764 B1 | * | 4/2002 | Katoh et al. .................. 326/93 |
| 2001/0040265 A1 | * | 11/2001 | Kim ............................ 257/499 |
| 2002/0017941 A1 | * | 2/2002 | Tsukagoshi et al. ......... 327/322 |
| 2002/0020873 A1 | * | 2/2002 | Klodzinski ................... 257/328 |
| 2002/0079927 A1 | * | 6/2002 | Katoh et al. .................. 326/86 |

FOREIGN PATENT DOCUMENTS

| EP | 0453070 A2 | * | 2/1991 | ........... H01L/21/82 |
| EP | 0905788 | | 3/1999 | |
| JP | 60-45053 | * | 3/1985 | ........... H01L/27/08 |

* cited by examiner

Primary Examiner—Mary Wilczewski
Assistant Examiner—Monica Lewis
(74) Attorney, Agent, or Firm—Burns, Doane, Swecker & Mathis, L.L.P.

(57) ABSTRACT

Linearity and/or efficiency of a power MOS transistor comprising a plurality of transistor segments connected in parallel, is improved in that at least one group of said transistor segments has a different threshold voltage than the rest of the transistor segments.

6 Claims, 2 Drawing Sheets

ARRANGEMENT IN A POWER MOSFET

This application claims priority under 35 U.S.C. §§119 and/or 365 to 0002714-4 filed in Sweden on Jul. 19, 2000; the entire content of which is hereby incorporated by reference.

TECHNICAL FIELD

The invention relates to power MOS transistors and more specifically to an arrangement for improving linearity and efficiency of such transistors.

BACKGROUND OF THE INVENTION

A power MOS transistor consists of an intrinsic structure that repeats itself over and over again. Thus, a power MOS transistor can be seen as a plurality of small transistor segments connected in parallel.

The power MOS transistor operates with its source terminal connected to ground and its drain terminal connected to a positive supply voltage.

When a positive voltage on its gate terminal exceeds a threshold voltage of the transistor, an n-type inversion region will form underneath its gate, allowing for current to pass between its drain and source.

Traditionally, the threshold voltage is desired to be uniform throughout the transistor so that current sharing is equal between the transistor segments and maximum efficiency is obtained when the transistor is operating at full power. This is to say that all transistor segments shall have the same threshold voltage.

In e.g. a power LDMOS transistor operating in class AB, a gate DC bias voltage slightly above the threshold voltage will cause a quiescent drain current to flow through the transistor.

The quiescent drain current is a relatively small contributor to the total drain current consumption at full output power, typically around 10%, and thus has little impact on overall efficiency.

At low levels of output power (so called backed-off conditions), this is no longer true. Here, the quiescent drain current is a significant, or even the dominant, contributor to total drain current consumption.

In an LDMOS transistor, linearity will improve significantly as output power is decreased, which is why the backed-off mode of operation is of particular interest.

Linearity performance is also a strong function of gate DC bias.

There exists an optimal quiescent drain current value that results in best linearity performance at a given output power level. To lower the quiescent drain current further in order to improve efficiency will degrade the linearity.

SUMMARY OF THE INVENTION

The object of the invention is to improve efficiency and linearity in a power MOS transistor under backed-off operating conditions with maintained peak power capability.

This is attained in accordance with the invention in that at least one group of said transistor segments has another threshold voltage than the rest of the transistor segments.

Thus, the threshold voltage is graded throughout the transistor.

Hereby, more and more of the transistor, i.e. actually more and more transistor segments, will become active as the input voltage on its gate terminal is increased, allowing for improved efficiency and/or linearity under backed-off operating conditions with maintained peak power capability.

BRIEF DESCRIPTION OF THE DRAWING

The invention will be described more in detail below with reference to the appended drawings, in which.

DESCRIPTION OF THE INVENTION

Figure 1:
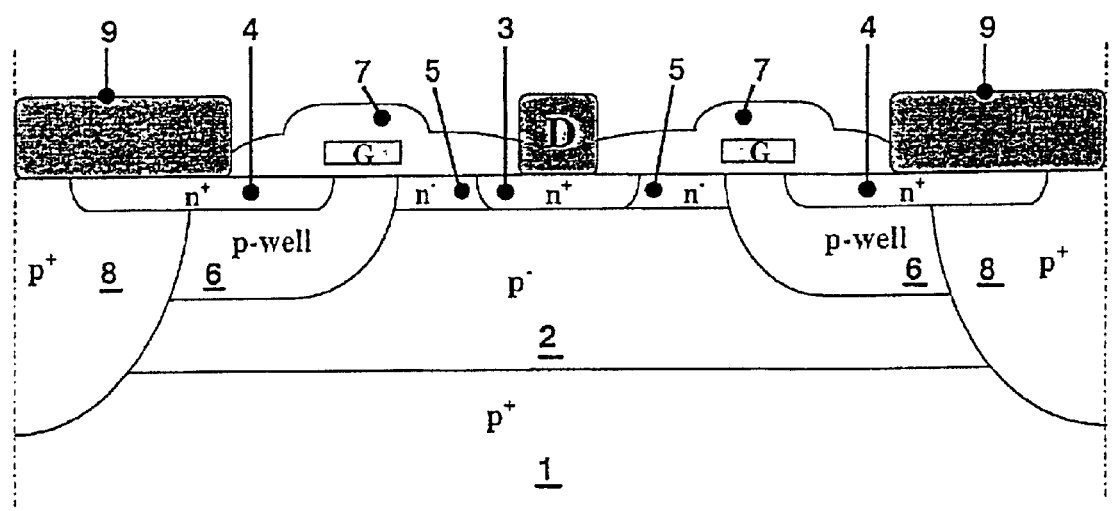
FIG. 1 is a cross-sectional view of two transistor segments of a power MOS transistor according to the invention.

FIG. 1 is a cross-sectional view of two adjacent transistor segments of a power LDMOS transistor according to the invention.

However, it is to be understood that the invention is not restricted to just LDMOS transistors.

In a manner known per se, the transistor is built into a $p^+$ silicon substrate 1 with a $p^-$ epitaxial layer 2 on its one side and a source metal layer (not shown) on its other side.

$n^+$ source regions 4 and drain regions, each comprising an $n^+$ drain contact region 3 surrounded on both sides by $n^-$ drift regions 5, are provided in the $p^-$ layer 2. A drain metal finger D is provided on top of the $n^+$ drain contact region 3.

Gate fingers G are embedded in dielectric layers 7 on both sides of the drain metal finger D on top of the $p^-$ layer 2. A p-well 6 is diffused laterally under each gate finger 7 from its source side.

Deep diffused $p^+$ regions 8 allow for current to pass from the $n^+$ source regions 4 to the $p^+$ substrate 1 with minimal voltage drop by means of clamps 9, i.e. metallic contacts, that short-circuit the $n^+$ source regions 4 and the $p^+$ regions 8.

As indicated in the introductory portion, the threshold voltage of the transistor segments is traditionally desired to be uniform throughout the transistor so that current sharing is equal between the transistor segments and maximum efficiency is obtained when the transistor is operating at full power.

However, as also indicated above, when the threshold voltage of the transistor segments is uniform throughout the transistor, efficiency and linearity is not optimised when the transistor operates under so-called backed-off conditions, i.e. below its 1 dB compression point.

Figure 2:
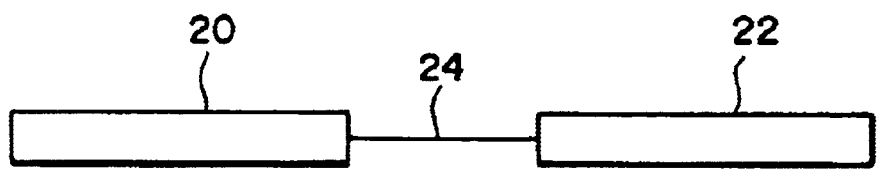
FIG. 2 is a view of transistor segments arranged on two separate but interconnected dies, in accordance with an embodiment of the invention.

According to the invention, the threshold voltage of the transistor segments is gradually adjusted throughout the transistor. In practice, groups of transistor segments will have different threshold voltages. These groups do not have to be located on one and the same die but can be located on different interconnected dies. To illustrate one exemplary embodiment, FIG. 2 shows a first die 20 and a second die 22. Each of the dies 20 and 22 includes transistor segments, such as shown in FIG. 1, but the threshold voltage of at least one group of transistor segments on the die 20 is different from the threshold voltage of another group of transistor segments located on the die 22. Respective transistor segments of the dies 20 and 22 are interconnected in parallel as shown by the general interconnection 24.

In operation, gate DC bias of the transistor according to the invention will be adjusted as to allow a quiescent drain current to flow only through the part of the transistor with the lowest threshold voltage.

As input signal voltage is increased, more and more of the transistor, i.e. more and more of the transistor segments, will become active, allowing for improved efficiency and linearity under backed-off operating conditions with maintained peak power capability.

The threshold voltage of an LDMOS transistor segment is determined by the gate oxide thickness, the concentration of boron under the gate, and the choice of gate finger material.

There are multiple ways to achieve graded threshold voltages in a transistor.

The most practical option to achieve graded threshold voltages is to vary the p-well doping.

It is normal practice to use one mask layer to define regions where the p-well implant is introduced into the silicon and then do one boron implantation followed by a furnace drive-in cycle.

To achieve graded threshold voltages, it is also possible to use multiple p-well implant masks and

- use different p-well implant doses or implant energies or implant tilt angles for different transistor segments and still follow up with one common furnace drive-in cycle,
- use the same p-well implant dose each time but different sequential drive-in cycles or
- use a combination of the above methods.

Other options to achieve graded threshold voltages in the transistor would be to

- vary the amount of n⁺ source lateral diffusion between the transistor segments using the same methods as described above,
- introduce varying degrees of threshold adjustment implants prior to gate formation,
- use polysilicon gate fingers with varying doping between transistor segments, or even use different gate materials or
- vary the gate oxide thickness between transistor segments.

Depending on the exact process set-up, more options should readily be available to anyone skilled in the art.

If two or more separate transistor dies with different threshold voltages are assembled in parallel in the same package, the basic principle is still valid.

EXAMPLE

By adjusting e.g. the p-well implant tilt angle, the threshold voltage was adjusted for an LDMOS transistor operating in the 1.8–2.0 GHz region, so that one half of the transistor had a threshold voltage that was approximately 0.3 V lower than that of the other half.

As a consequence, two-tone intermodulation distortion (IMD), which is a common measure of linearity performance, was improved by approximately 3 dB at an output power level 17 dB below its 1 dB compression point, compared to the case with uniform threshold voltage.

What is claimed is:

1. A power LDMOS transistor amplifier comprising:
   a plurality of transistor segments, wherein:
      each of the transistor segments comprises a source, a gate, and a drain, a well, and a drain drift region interconnecting said drain and said well; and
      all of the transistor segment sources are connected together;
      all of the transistor segment gates are connected together; and
      all of the transistor segment drains are connected together,
   wherein:
      each of the transistor segments in a first group of the transistor segments has a first threshold voltage;
      each of the transistor segments in a second group of the transistor segments has a second threshold voltage; and
      the first threshold voltage is different from the second threshold voltage,
      wherein each of said transistor segments has a threshold voltage and wherein the threshold voltage of said transistor segments is graded throughout said power LDMOS transistor,
   wherein, during operation of said power LOMOS transistor, more and more of said transistor segments become active as an input voltage on said transistor segment gates is increased, allowing for improved efficiency or linearity under backed-off operating conditions with maintained peak power capability.

2. A power LDMOS transistor amplifier comprising:
   a plurality of transistor segments, wherein:
      each of the transistor segments comprises a source, a gate, and a drain, a well, and a drain drift region interconnecting said drain and said well; and
      all of the transistor segment sources are connected together;
      all of the transistor segment gates are connected together; and
      all of the transistor segment drains are connected together,
   wherein:
      each of the transistor segments in a first group of the transistor segments has a first threshold voltage;
      each of the transistor segments in a second group of the transistor segments has a second threshold voltage; and
      the first threshold voltage is different from the second threshold voltage, wherein said power LDMOS transistor operates under backed-off conditions.

3. A power LOMOS transistor amplifier comprising:
   a plurality of transistor segments, wherein:
      each of the transistor segments comprises a source, a gate, and a drain, a well, and a drain drift region interconnecting said drain and said well; and
      all of the transistor segment sources are connected together;
      all of the transistor segment gates are connected together; and
      all of the transistor segment drains are connected together,
   wherein:
      each of the transistor segments in a first group of the transistor segments has a first threshold voltage;
      each of the transistor segments in a second group of the transistor segments has a second threshold voltage; and
      the first threshold voltage is different from the second threshold voltage, wherein, during operation of said power LDMOS transistor, a gate DC bias of the power LDMOS transistor is adjusted as to allow a quiescent drain current to flow only through a part of the transistor, which part comprises the transistor segments having the lowest threshold voltage.

4. The power LDMOS transistor amplifier of claim 1, wherein said power LDMOS transistor operates in class AB.

5. The power LDMOS transistor amplifier of claim 1 wherein said power LDMOS transistor operates in the 1.8–2.0 Ghz region.

6. The power LOMOS transistor amplifier of claim 1, wherein said transistor segment sources are grounded and said transistor segment drains are connected to a positive supply voltage.

\* \* \* \* \*